(12) United States Patent
Muñoz et al.

(10) Patent No.: US 6,424,276 B1
(45) Date of Patent: Jul. 23, 2002

(54) SUCCESSIVE APPROXIMATION ALGORITHM-BASED ARCHITECTURES AND SYSTEMS

(75) Inventors: Carlos Esteban Muñoz, Austin; Karl Ernesto Thompson, Converse; Douglas S. Piasecki; Wai Laing Lee, both of Austin; Eric Swanson, Buda, all of TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/393,093

(22) Filed: Sep. 9, 1999

(51) Int. Cl.$^7$ .................................................. H03M 1/10
(52) U.S. Cl. ........................ 341/120; 341/118; 341/115; 341/119; 341/94
(58) Field of Search ........................... 341/120, 94, 115, 341/118, 119

(56) References Cited

U.S. PATENT DOCUMENTS

| | | | | |
|---|---|---|---|---|
| 4,336,526 A | * | 6/1982 | Weir .................... | 340/347 AD |
| 4,679,028 A | * | 7/1987 | Wilson et al. ............... | 341/120 |
| 4,709,225 A | * | 11/1987 | Welland et al. ............. | 341/120 |
| 4,967,197 A | * | 10/1990 | Peng .......................... | 341/118 |
| 4,970,514 A | * | 11/1990 | Draxelmayr ................ | 341/120 |
| 5,172,115 A | * | 12/1992 | Kerth et al. ................ | 341/118 |
| 5,440,305 A | * | 8/1995 | Singnore .................... | 341/120 |
| 5,666,118 A | * | 9/1997 | Gersbach .................... | 341/120 |
| 6,268,813 B1 | * | 7/2001 | Dwitt .......................... | 341/120 |

* cited by examiner

*Primary Examiner*—Michael Tokar
*Assistant Examiner*—Lam T. Mai
(74) *Attorney, Agent, or Firm*—Skjerven Morrill MacPherson LLP

(57) ABSTRACT

A digital calibration system for an analog-to-digital converter system includes a computational system receiving digital bits from an analog-to-digital converter representing selection of elements of the digital-to-analog converter in response to an analog input. The computational engine produces a digital output representative of the analog input during conversion operation, and digital values for adjustment of an adjustable analog source during calibration. Further, a digital system comprises a radix-less-than-two non-configurable digital-to-analog converter, a comparator system connected to the converter, and a computational system configured for SAR calibration and conversion.

19 Claims, 10 Drawing Sheets

SILICON IMPLEMENTATION OF DIGITAL CALIBRATION SYSTEM FOR ANALOG-TO-DIGITAL CONVERTER

SUCCESSIVE APPROXIMATION ALGORITHM-BASED ARCHITECTURES AND SYSTEMS

CROSS-REFERENCE TO RELATED APPLICATIONS

This application is related to the following patent applications which are expessly referred to and incorporated herein in their entirety:

(1) "System and Method for Adaptive Auto-Calibration of Radix<2 A/D SAR Converters with Internally Generated Stimuli" invented by Carlos Esteban Muñoz, Karl Ernesto Thompson, Douglas S. Piasecki, Wai Laing Lee, and Eric Swanson; U.S. patent application Ser. No. 09/393,828, filed on Sep. 9, 1999;

(2) "System and Method Of Selecting and Using Bit Testing Sequences During Successive Approximation For Calibrating An Analog-to-Digital Converter" invented by Carlos Esteban Muñoz, Karl Ernesto Thompson, Douglas S. Piasecki, Wai Laing Lee, and Eric Swanson; U.S. patent application Ser. No. 09/393, 091, filed on Sep. 9, 1999;

(3) "Precision Voltage Source Systems And Methods For Digital Calibration of Successive Approximation Analog-to-digital Systems" invented by Carlos Esteban Muñoz, Karl Ernesto Thompson, Douglas S. Piasecki, Wai Laing Lee, and Eric Swanson; U.S. patent application Ser. No. 09/393,079, filed on Sep. 9, 1999;

(4) "System and Apparatus For Digitally Calibrating Capacitors In An Analog-to-Digital Converter Using Successive Approximation" invented by Carlos Esteban Muñoz, Karl Ernesto Thompson, Douglas S. Piasecki, Wai Laing Lee, and Eric Swanson; U.S. patent application Ser. No. 09/393,826, filed on Sep. 9, 1999;

(5) "Memory And Accumulation Methods And Systems For Calibration Ana conversion With Digital-To-Analog (AID) Converter" invented by Carlos Esteban Muñoz, Karl Ernesto Thompson, Douglas S. Piasecki, Wai Laing. Lee, and Eric Swanson; U.S. patent application Ser. No. 09/394,809, filed on Sep. 9, 1999;

(6) "System and Method For Digitally Calibrating An Analog-to-Digital Converter" invented by Carlos Esteban Muñoz, Karl Ehesto Thompson, Douglas S. Piasecki, Wai Laing Lee, and Eric Swanson; U.S. patent application Ser. No. 09/393,046, filed on Sep. 9, 1999;

(7) "Calibrated Quasi-Autozeroed Comparator Systems and Methods" invented by Karl Ernesto Thompson, Carlos Esteban Muñoz, Douglas S. Piasecki, Wai Laing Lee, and Eric Swanson; U.S. patent application Ser. No. 09/393,055, filed on Sep. 9, 1999.

BACKGROUND OF THE INVENTION

1. Field of the Invention

The present invention relates to adaptive calibration of capacitor values in a successive approximation analog-to-digital converter having a radix weighted multi-capacitor charge redistribution digital-to-analog converter (CRDAC), and more particularly to adaptive calibration of the capacitor values in the CRDAC, and successive approximation algorithm-based methods and systems for digital calibration of digital-to-analog converter (DAC) elements in an analog-to-digital (A/D) converter, including determination and control of feedback constant during SAR processing.

2. Description of the Related Art

One attempt to design a successive approximation adaptive calibration architecture with feedback is described in David R. Welland's U.S. Pat. No. 4,709,225 (granted in 1987). Binary weighting after wafer fabrication is set forth in the patent according to the Welland approach, which includes adjusting an array of capacitors scaled according to a radix 2 (i.e., binary) function, resulting in non-overlap.

Related art U.S. Pat. No. 4,336,526 granted to Basil Weir describes successive approximation analog-to-digital (A/D) conversion using a radix less than two weighted digital-to-analog converter (DAC) in a feedback loop using a comparator and a successive approximation register (SAR) logic circuit to solve the binary non-overlap problem. A proposed conversion operation produces a digital output representative of an unknown analog input. A DAC accepts a digital word comprising a sequence of series bits, to produce a corresponding analog voltage value. An impedance network is described including capacitors, for example, which have sequential capacitance values which are a function of radix less than two. Costly and complicated switching circuits precisely represent accurate series weights in such an impedance network. A first analog cancellation voltage is produced in the DAC with a selected most significant bit (MSB) capacitance. The first analog cancellation voltage is input to a comparator to set-off a received analog voltage which is to be converted into digital form by SAR conversion. If the first analog cancellation voltage from the MSB is insufficient to cancel out the received analog voltage under conversion, as evidenced by the sign of the output value from the comparator, then the tested MSB is kept. Unfortunately, Weir does not show or suggest adaptive calibration.

In a binary sequence network, the most significant binary capacitance in a selected impedance network of n capacitors slightly exceeds the sum of the remaining totality of less significant capacitances. Accordingly, if by virtue of noise or some other ancillary effect, a MSB is erroneously kept, then not even summing all the contributions from the remaining less significant bits will result in an approximation which has a cumulative value greater than the voltage of the capacitor associated with the most significant bit. In other words, the use of radix less than two for successive approximation according to the prior art is technically disadvantageous, because for radix less than two, there is no recovery from an erroneous (e.g., noise-induced) approximation with a particular most significant value bit, because the sum of the less significant bit capacitances or voltage figures does not reach either singly or cumulatively to the magnitude of the single erroneously kept voltage or capacitance level. Simply stated, with a radix less than two series, there is no redundancy which permits alternative expressions of particular voltage or capacitance levels.

An additional technical problem is the employment of DAC elements having imprecise values which are not known. It is accordingly desirable to be able to self-realize the actual values of the DAC elements which are selected for approximation.

One technical problem in successive approximation in a redundant system under noisy conditions is that a more significant, i.e., greater magnitude, element is erroneously kept as a result of the noise. Because the actual voltage being tested has thus been over approximated, all remaining lesser magnitude test elements will fail and not be kept, but still the overapproximation cannot be corrected, because the remaining course of successive approximation will only query whether to increase the estimate, which is already excessive, by increasingly diminished test values. Unfortunately, there are no negative test values which can chip away at or reduce the excessive magnitude element already kept. Accordingly, it is desirable to avoid erroneous, noise-induced selection of excessively large test elements.

SUMMARY OF THE INVENTION

According to the present invention, a successive approximation system includes a digital calibration and conversion subsystem including a digital-to-analog converter system, and a computational system connected to said digital-to-analog converter system for digital calibration of elements in said digital-to-analog converter system with digital calibration values representative of actual elements in said digital-to-analog converter system. Further, according to one embodiment of the present invention, imprecise DAC elements are selected and arranged in succession within a redundant, radix<2 envelope. According to one embodiment, the imprecise DAC elements substantially follow the contour of the envelope of a selected radix value which is less than two. Further according to the present invention, digital calibration of DAC elements in an ADC is adaptive, i.e., responsive to the precise actual element values. The DAC element values are not adjusted electrically or mechanically to follow a predetermined scheme or curve. Instead, the actual DAC element values are accommodated and used for self-calibration in adaptive fashion depending on their actual physical values. Digital weights representing the actual DAC element values are stored in memory digitally.

According to one embodiment of the present invention, adaptive calibration of a charge redistribution digital-to-analog converter includes producing a set of sampling bits to connect sampling components such as capacitors or resistors to a selected reference voltage. Different sets of sampling bits are used to cover a selected calibration range, with the sampling sets being predetermined, fixed, random, or pseudo-random. Each set of sampling bits produces a corresponding sampled value. The sampled value is approximated with successive balancing values produced with corresponding sets of balancing bits. An analog residue is produced from the difference between the sampled and balancing values. Digital weights are generated corresponding to the sampling and balancing bits. A digital residue is determined from the difference between the sampling and balancing digital weights. The charge redistribution digital-to-analog converter includes a set of multi-valued components which can redundantly approximate particular sampled values. According to one embodiment of the present invention, the set of components includes capacitors which can be organized into subsets of capacitance values which can redundantly approximate desired capacitance values within a predetermined range.

According to the present invention, adaptive calibration is accomplished without an external impulse by a non-binary companion bit charge redistribution digital-to-analog SAR converter. Companion bits are selected lower significance bits used with associated test bits to choose particular capacitors during SAR processing and having a predetermined magnitude relationship with the test bits. Conversion of SAR capacitors according to the present invention includes balancing a sampled charge with a group of capacitors having capacitance values scaled according to a radix less-than-two function and including companion bit capacitors.

DETAILED DESCRIPTION OF THE PREFERRED EMBODIMENTS

Figure 1:
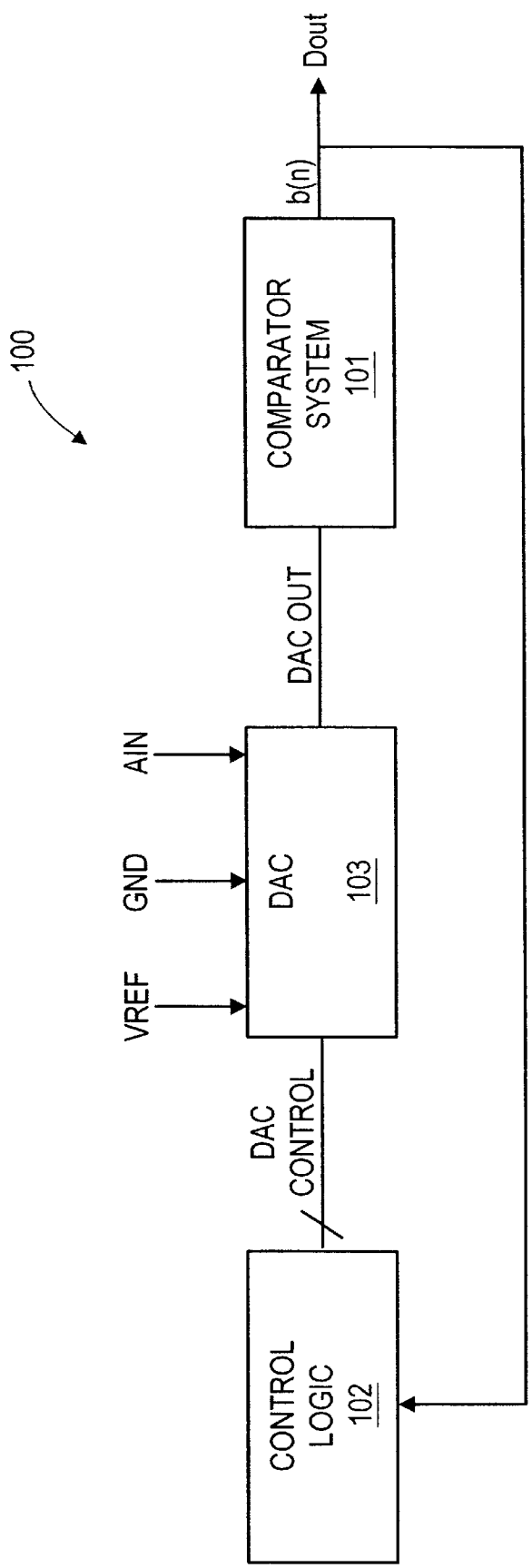
FIG. 1 is a block diagram of an adaptive successive approximation converter system according to the prior art.

Referring now to FIG. 1, there is shown a block diagram of a successive approximation converter system 100 according to the prior art. In particular, the converter system 100 includes a comparator 101 having first and second inputs, control logic circuitry 102 connected to comparator 101, and a configurable charge redistribution digital-to-analog converter 103. One input of comparator 101 is connected to ground. An output connection of the comparator 101 produces an output signal, DOUT. The control logic circuitry 102 is connected to digital-to-analog converter 103 which in turn is provided with a reference voltage (VREF) and an N-bit input control signal (DAC CONTROL) from the control logic circuitry 102. The control logic circuitry 102 further includes a memory (not shown), a companion bit generator (not shown) and a linear feedback shift register (LFSR) (also not shown). The digital-to-analog converter 103 particularly includes a switching system (not shown), and a radix less-than-two capacitor array (not shown) connected to the output of the switching system. The output signal DOUT from comparator 101 is equal to (ideally) AIN/VREF during operation. DOUT is determined one bit at a time by comparing the DAC output (DAC OUT) to the analog input voltage, AIN. The DAC output is successively incremented and accumulated from the most significant bit (MSB) to the least significant bit (LSB), until DOUT equals AIN. For each DAC increment, the comparator output b(n) is used to form an output word for feedback to the DAC. Ideally, the output (DAC OUT) of the radix less-than-two DAC 103 is:

$$DOUT = \sum_{n=1}^{N} (1/r^n) \cdot b(n),$$

where n is an integer between 1 and N; 0<r<2 and preferably 1.8; N is a selected maximum integer value; and b(n) is the nth digit of a binary number. The memory in the configurable charge redistribution digital-to-analog converter 103 is used to store digital weights used by control logic circuitry 102.

Figure 2:
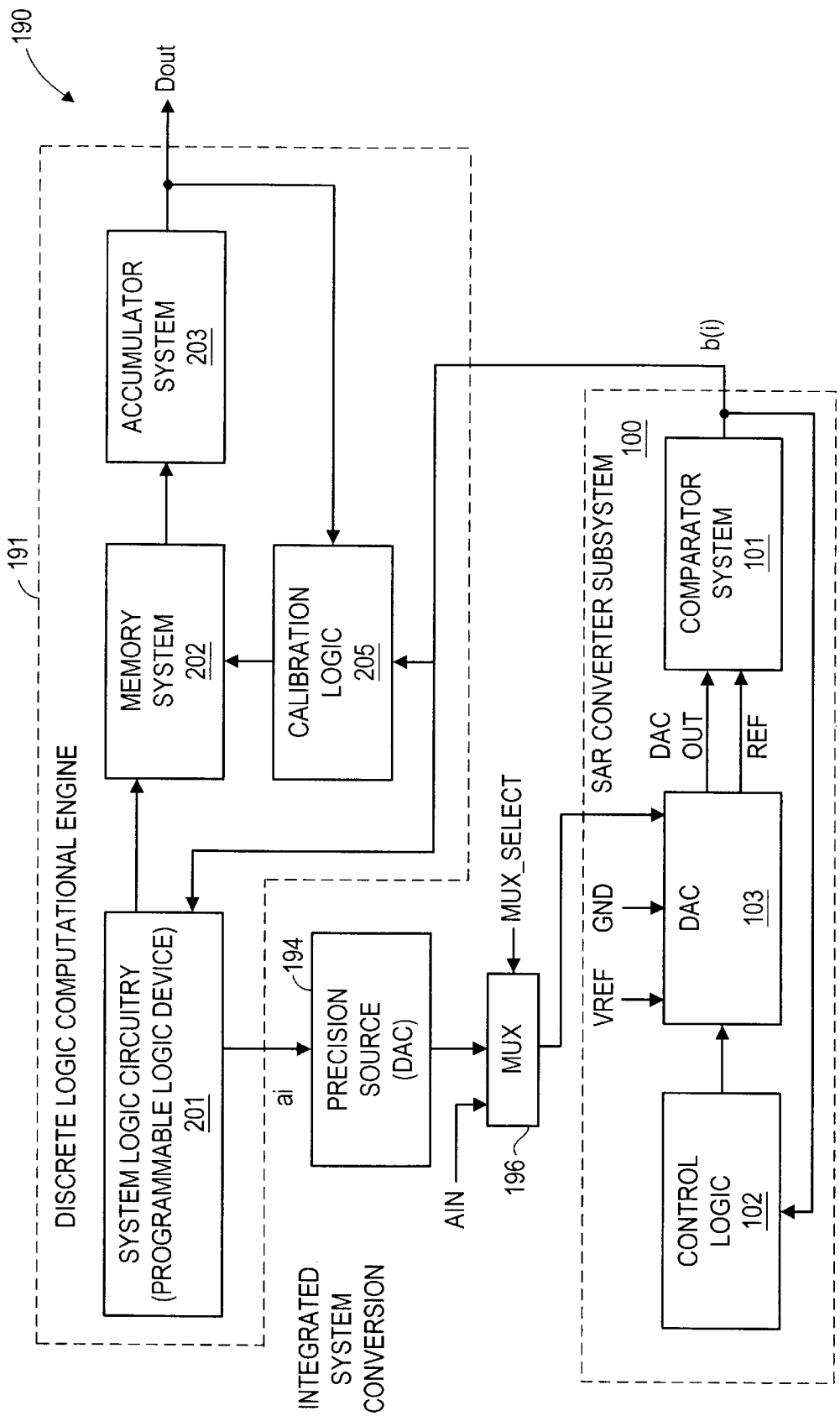
FIG. 2 is a block diagram of an auto-calibration SAR converter system according to one embodiment of the present invention.

Referring now to FIG. 2, there is shown a block diagram of an autocalibration SAR converter system 190 according to an embodiment of the present invention. The SAR converter system 190 particularly includes a successive approximation register (SAR) converter subsystem 100 configured to produce output bits b(i) and a discrete logic computational engine 191 connected to the SAR converter subsystem 100 for receiving b(i) from the SAR converter subsystem 100. The discrete logic computational engine 191 produces an output ai in response to the receipt of output bits b(i). The SAR converter system 190 further includes a precision source 194 which receives the output ai. The SAR converter system 190 further includes a multiplexer 196 connected to the SAR converter subsystem 100. The multiplexer 196 is further connected to the precision source 194, permitting the multiplexer 196 to receive an analog signal precisely defined by the ai signal received by the precision source 194. According to one embodiment of the present invention, the precision source 194 is a highly precise, commercially available analog signal source in the nature of a digital to analog converter (DAC). The discrete logic computational engine 191 includes system logic circuitry 201 in the nature of a programmable logic device for example without limitation; The discrete logic computational engine 191 further includes a memory system 202 connected to the system logic circuitry 201 for storing calibration values and Other information produced by the system logic circuitry 201. The discrete logic computational engine 191 further includes an accumulator system 203 connected to the memory system 202 for aggregating selected memory values in combination with preceding values already further includes calibration logic circuitry 205 connected to the SAR converter subsystem 100 to receive the b(i) values produced by the SAR converter subsystem 100 and connected to accumulator system 203 to receive DOUT. The calibration logic circuitry 205 produces a value for storage in memory system 202 which is a function of both DOUT and b(i). The multiplexer 196 additionally receives an input value MUX_SELECT, enabling it to switch output signals between precise analog signals received from precision source 194 and test signals such as AIN. Thus, system logic circuitry 201, memory system 202, accumulator system 203, and calibration logic circuitry 205 comprise the primary structural blocks of the discrete logic computational engine 191 according to one embodiment of the present invention.

The SAR converter subsystem 100 in turn includes comparator system 101, control logic circuitry 102, and DAC 103. More particularly, the system logic circuitry 201 controls the memory system 202 subject to modifications made by calibration logic circuitry 205. The accumulator system 203 receives values from memory system 202 to produce an output value DOUT which is provided to the calibration logic 205 for altering data values in the memory system 202. The multiplexer 196 receives input values from precision source 194 and the AIN signal for delivery to SAR converter subsystem 100, according to direction from a multiplexer control signal MUX_SELECT. SAR converter subsystem 100 additionally receives values of VREF and ground (GND), as well as a multiplexer control signal selected value from multiplexer 196. Control logic circuitry 102 is connected to DAC 103 in order to apply control input signals. The control logic circuitry 102 is further connected to receive comparator output signals b(i) for operation of the control logic defined in control logic circuitry 102. The output signals b(i) from the comparator system 101 are also provided to the system logic circuitry 201 and the calibration logic circuitry 205 according to one embodiment of the present invention. DAC 103 includes a radix less-than-two capacitor bank (not shown) which is connected for output to comparator system 101. SAR converter subsystem 100 further includes an input/output (I/O) port (not shown) which is connected through a parallel bus (PBUS) (not shown) and system logic circuitry 201 to memory 202 which in turn is connected to the accumulator system 203.

Comparator system 101 is connected to discrete logic computational engine 191, according to one embodiment, which controls calibration and operation in accordance with the present invention. Memory system 202 stores digital weights for modeling sampling and balancing capacitors, as well as representing offset voltages affecting SAR measurement as a digital weight. System logic circuitry 201 increments an LFSR (not shown) to determine pseudo-randomly the selection of sample bits used in SAR processing for auto-calibrating the SAR converter subsystem 100. Then, system logic circuitry 201 generates successive bit sequences including companion bits to connect progressively more comprehensive groups of balancing capacitors for in one case auto-calibration, or another case, approximation of unknown input analog voltages. Successive approximation results in recursively increasing the precision and accuracy of the digital weights which are stored in memory 202 as representations for sampling and balancing capacitors or voltage offsets. Accumulator system 203 produces a signed digital residue by comparing a sampling capacitor and balancing capacitor weights from memory 202.

Figure 3:
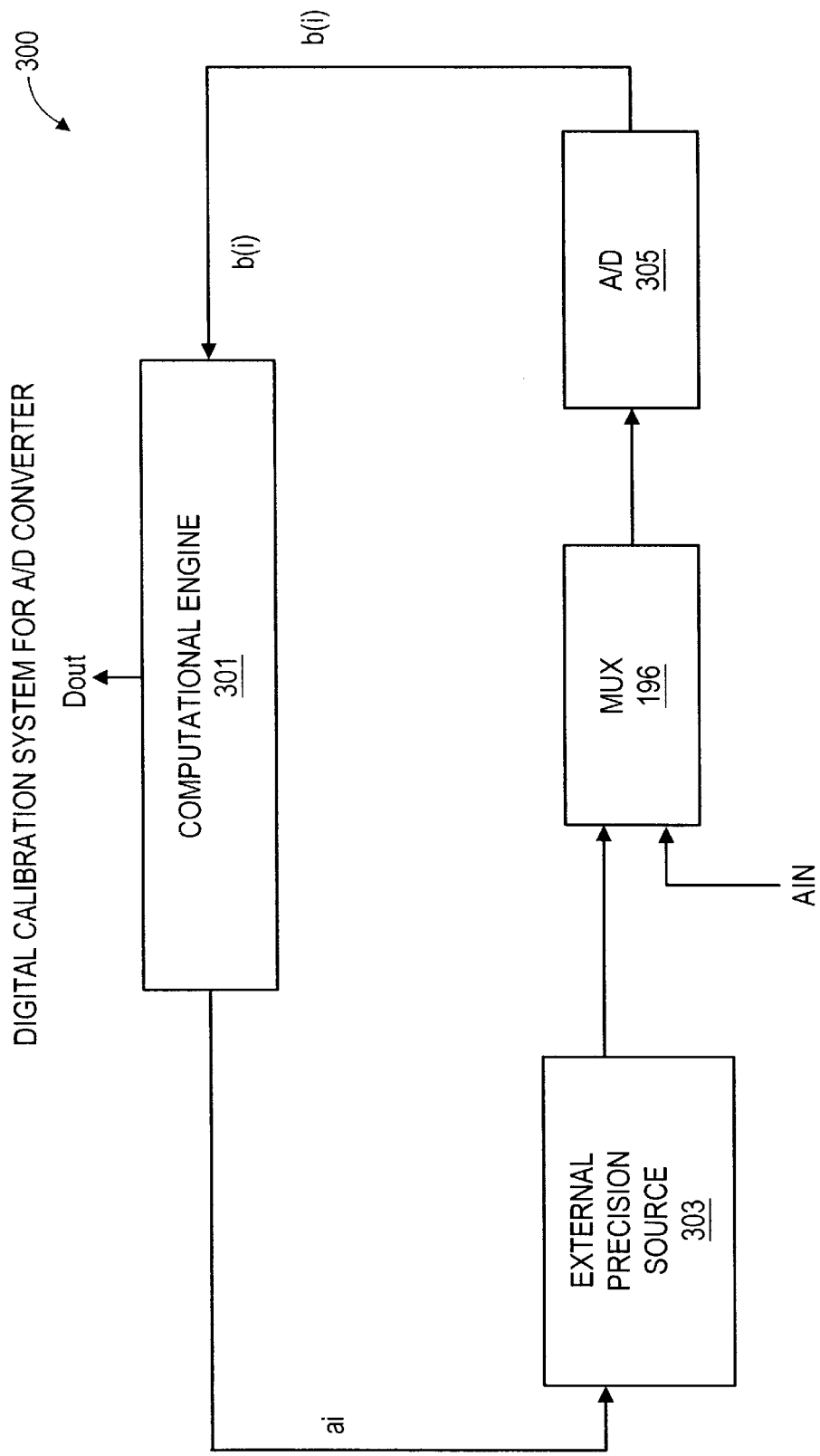
FIG. 3 is a block diagram of an auto-calibration SAR converter system according to another embodiment of the present invention.

Referring now to FIG. 3, there is shown a block diagram of a digital calibration system 300 for an analog-to-digital converter, according to another embodiment of the present invention. The digital auto-calibration SAR converter system 300 includes computational engine 301, an external precision source circuit 303, multiplexer 196, and an analog-to-digital converter 305, according to the present invention. The computational engine 301 produces an output signal DOUT and an output signal ai, based upon information received from analog-to-digital converter 305. The precision source 303 in turn provides an output signal to multiplexer 304 which also receives an input signal AIN, to produce an output multiplexer signal provided to analog-to-digital (A/D) converter 305 for conversion to digital form.

Figure 4:
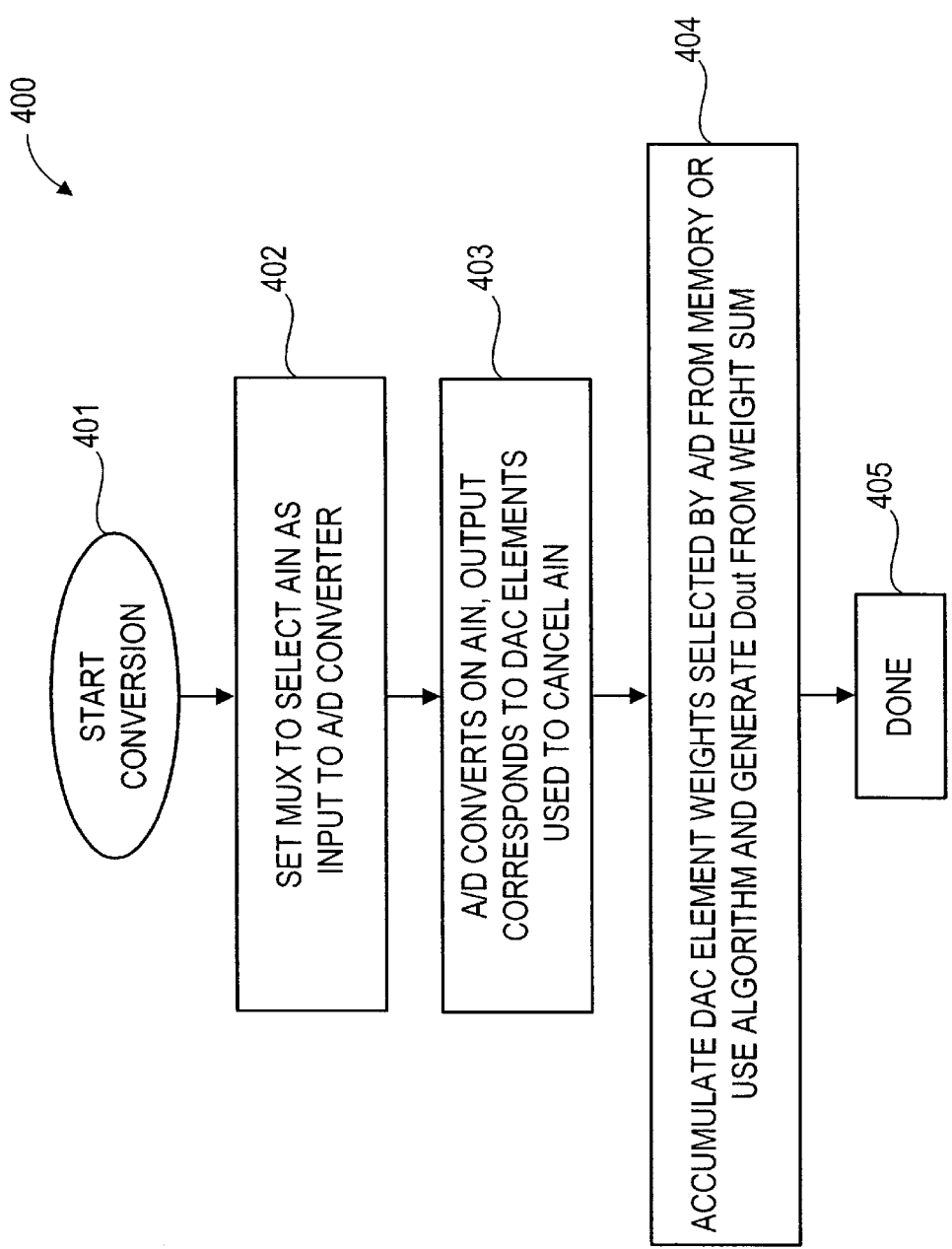
FIG. 4 is a flow chart of operation of a successive approximation method according to one embodiment of the present invention.

FIG. 4 is a flow chart of normal operation of a successive approximation method 400 according to the present invention. In particular, the method 400 begins as conversion operation starts 401. Next, a multiplexer is set to provide signal AIN as an input to an A/D converter in process 402. Then, the AID converter converts the input signal AIN, with the output of the A/D converter corresponding to DAC elements used to cancel the AIN as an input signal in process 403. The DAC element weights selected by the AMD converter from memory are accumulated, or an algorithm is performed and an output signal DOUT is generated from a weight sum in process 404. Accordingly, successive approximation according to the present invention is completed, as indicated by process 406.

Figure 5:
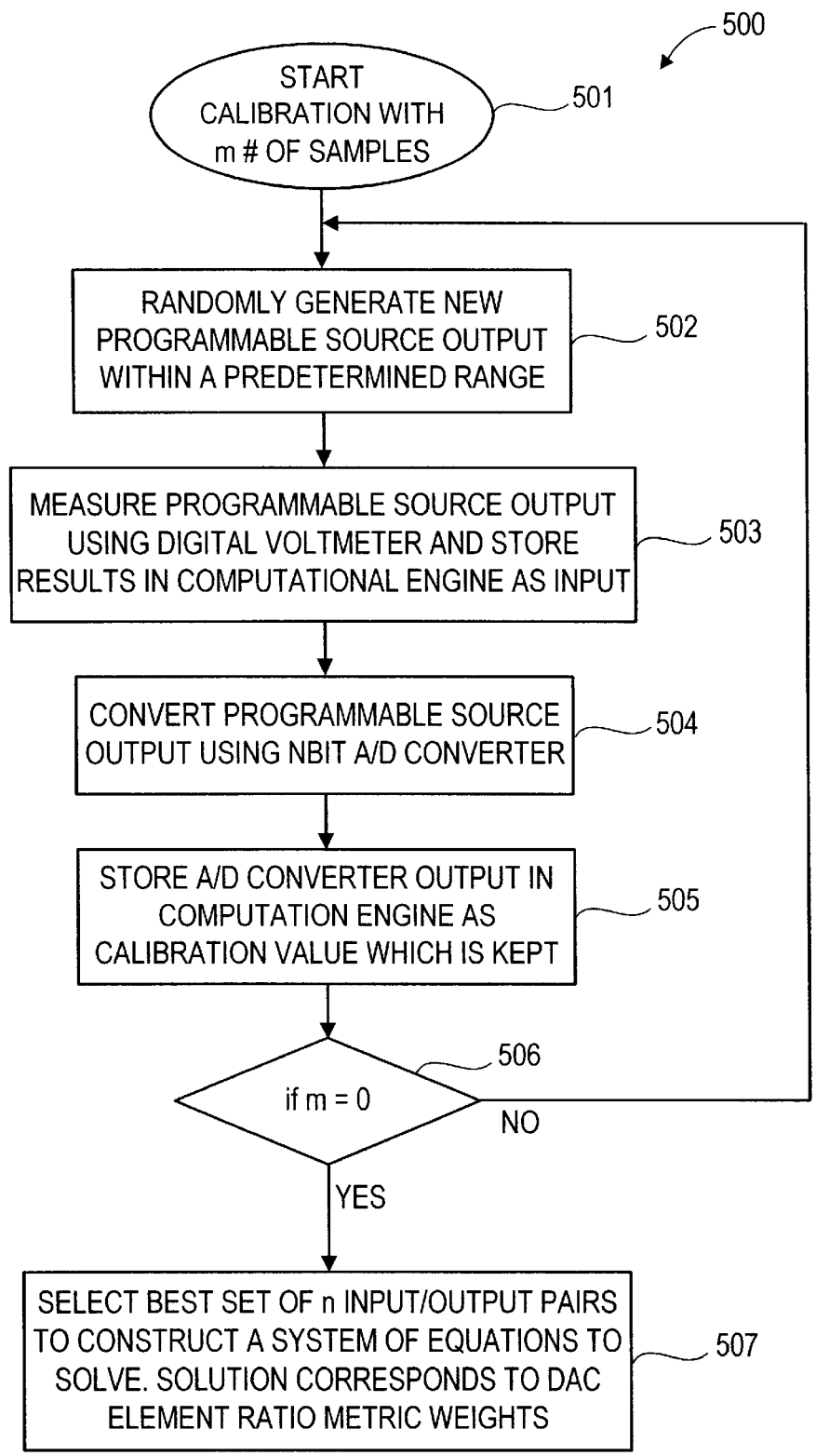
FIG. 5 is a flow chart of operation of the functionality of a successive approximation method according to one embodiment of the present invention.

FIG. 5 is a flow chart of calibration operation in a successive approximation method 500 according to the present invention. In particular, the method 500 begins as calibration operation starts with process 501 with "m" equaling a selected number of samples. Next, a random generation of a new programmable source output within a predetermined range is accomplished in process 502. Then, process 503 measures a programmable source output using a digital volt meter, and the results are stored in a computational engine as an input value. Process 504 uses an n-bit analog-to-digital converter to convert the programmable source output. Thereafter, process 505 provides the analog-to-digital converter output for storage in the computational engine as a calibration value which is kept. If "m" does not equal zero according to a test, process 506 repeats processes 502–505 with random generation of a new programmable source output. If m=0, then a best set of n input/output pairs is used in process 507 to construct a solvable system of equations. The solution corresponds to DAC element ratio metric weights.

Figure 6:
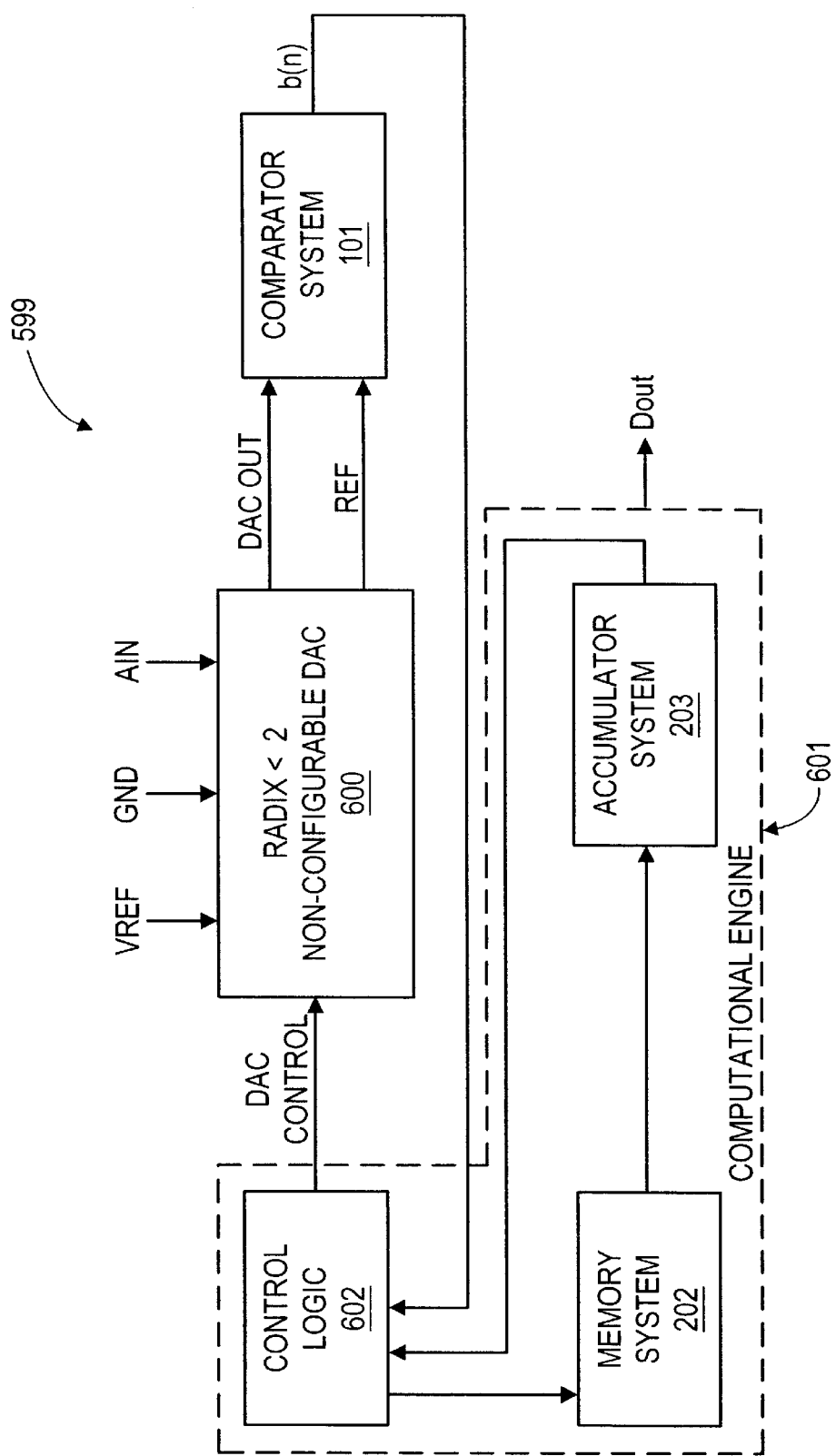
FIG. 6 is a block diagram of an auto-calibration successive approximation converter system according to the present invention.

Referring now to FIG. 6, there is shown a block diagram of a successive approximation converter system 599 according to the present invention. In particular, the converter system 599 includes a comparator system 101 having first and second inputs receiving respective reference (REF) and digital-to-analog converter (DAC) outputs from a radix-less-than-two non-configurable DAC 600 according to one embodiment of the present invention. The radix-less-than-two non-configurable DAC 600 is configured to receive DAC control signals according to one embodiment of the present invention, and to produce the REF and DAC out signals based on input signals VREF, GND, and AIN received by the radix-less-than-two non-configurable DAC 600. The computational engine 601 includes control logic circuitry 602, memory system 202 connected to control logic circuitry 602, and accumulator system 203. One input of comparator 201 is connected to radix-less-than-two non-configurable DAC 600, to enable receipt of an output signal. Another input of comparator 201 is connected to radix-less-than-two non-configurable DAC 600, to enable receipt of an input reference signal.

The comparator system 101 produces an output binary signal set b(n) that is received by control logic circuitry 602. The control logic circuitry 602 stores values in memory system 202 and produces DAC control signals (DAC CONTROL) for radix-less-than-two non-configurable configurable DAC 600. The accumulator system 203 accumulates information from memory system 202 and produces an output signal DOUT in response to input signals VREF, GND, and AIN.

Figure 7:
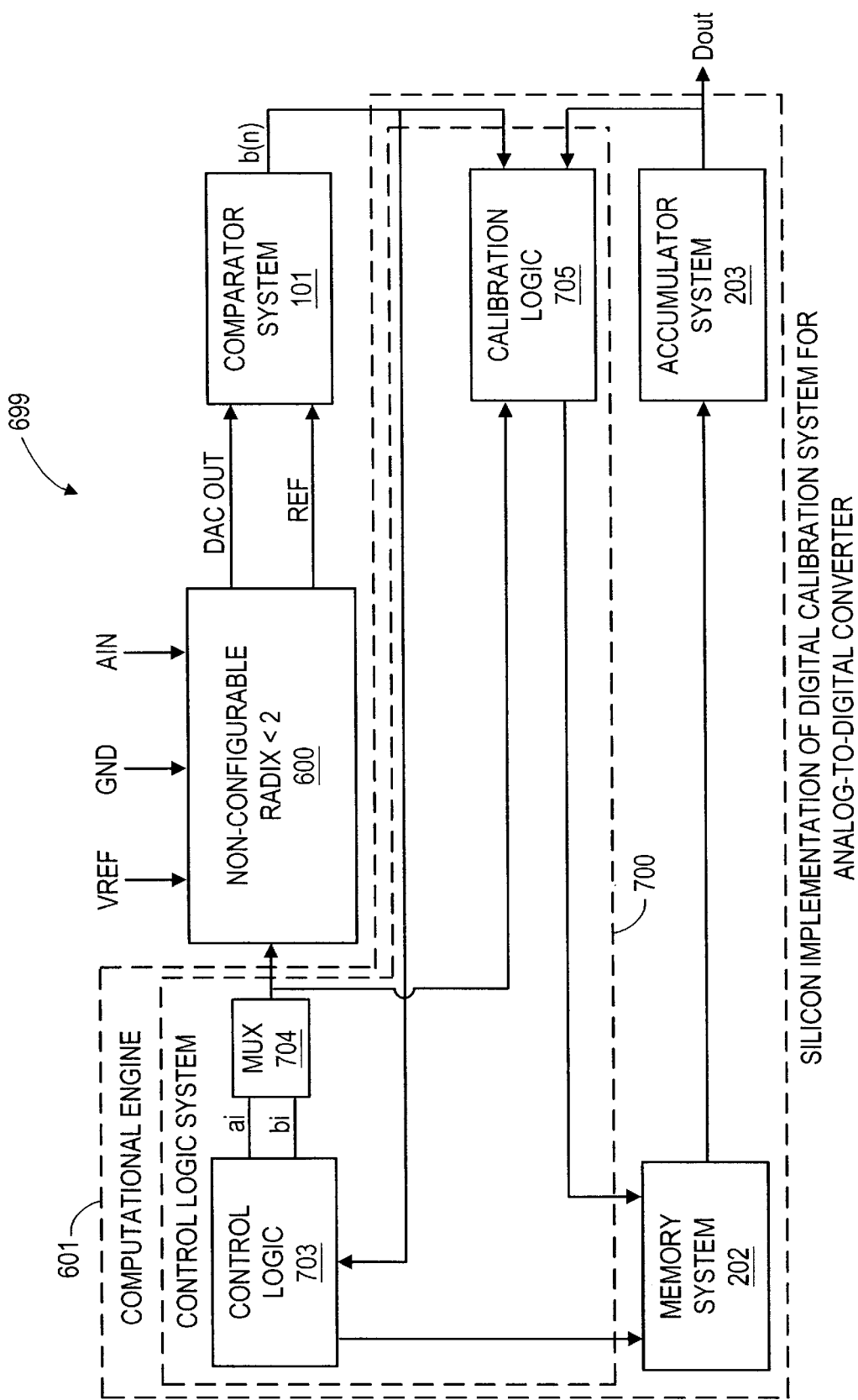
FIG. 7 is a block diagram of an successive approximation converter system according to the present invention.

Referring now to FIG. 7, there is shown a block diagram of an successive approximation converter system 699 according to the present invention which is designed for silicon implementation of a digital calibration system for an analog-to-digital converter. In particular, the converter system 699 includes a comparator system 101 having first and second inputs receiving respective reference (REF) and digital-to-analog converter (DAC) outputs signals. The converter system 699 further includes a radix-less-than-two non-configurable DAC 600 and a computational engine 601 according to one embodiment of the present invention. The radix-less-than-two non-configurable DAC 600 is configured to receive DAC control signals according to one embodiment of the present invention, and to produce output signals DAC OUT and REF in response to input signals VREF, GND, and AIN received by the radix-less- than-two non-configurable DAC 600. The computational engine 601 includes control logic system 700, memory system 202 connected to control logic circuitry 703, and accumulator system 203. One input of comparator system 101 is connected to radix-less-than-two non-configurable DAC 600, to enable receipt of an output signal. Another input of comparator 101 is connected to radix-less-than-two non-configurable DAC 600, to enable receipt of an input reference signal. The comparator system 101 produces an output binary signal set b(n). The control logic system 700 stores values in memory system 202 and produces DAC control signals for radix-less-than-two non-configurable DAC 600. The accumulator system 203 is connected to memory system 202 for receiving memory information for accumulation and to produce an output signal DOUT in response to input signals VREF, GND, and AIN. The converter system 699 further includes a comparator system 101 having first and second inputs, control logic system 700 connected to comparator system 101, and radix-less-than-two non-configurable digital-to-analog converter 600. One input of comparator system 101 is connected to radix-less-than-two non-configurable DAC 600 to receive a DAC output signal. Another input of comparator system 101 is connected to radix-less-than-two non-configurable DAC 600 to receive an input reference signal. Control logic system 700 produces a DAC control signal to be provided to radix-less-than-two non-configurable DAC 600. The converter system 699 further includes memory system 202 for receiving storage values from control logic system 700, and accumulator system 203 connected to memory system 202 for receiving memory information for accumulation, to enable production of output signal DOUT. Further, the control logic system 700 includes a multiplexer 704, calibration logic circuitry 705, and control logic circuitry 703. The multiplexer 704 receives first and second signal sets ai and bi from control logic circuitry 703, and selects one or the other of the signal sets ai and bi for transmission to radix-less-than-two non-configurable digital-to-analog converter 600. Calibration logic circuitry 705 is connected to memory system 202, accumulator system 203, comparator system 101, and multiplexer 704. Calibration logic circuitry 705 receives multiplexer signals from multiplexer 704 and comparator output signals b(n) from comparator system 101. Further, calibration logic circuitry 705 receives accumulator output signals DOUT from accumulator system 203. Memory system 202 receives control logic signals from control logic circuitry 703 and calibration logic signals from calibration logic circuitry 705. Memory system 202 provides output signals to accumulator system 203.

Figure 8:
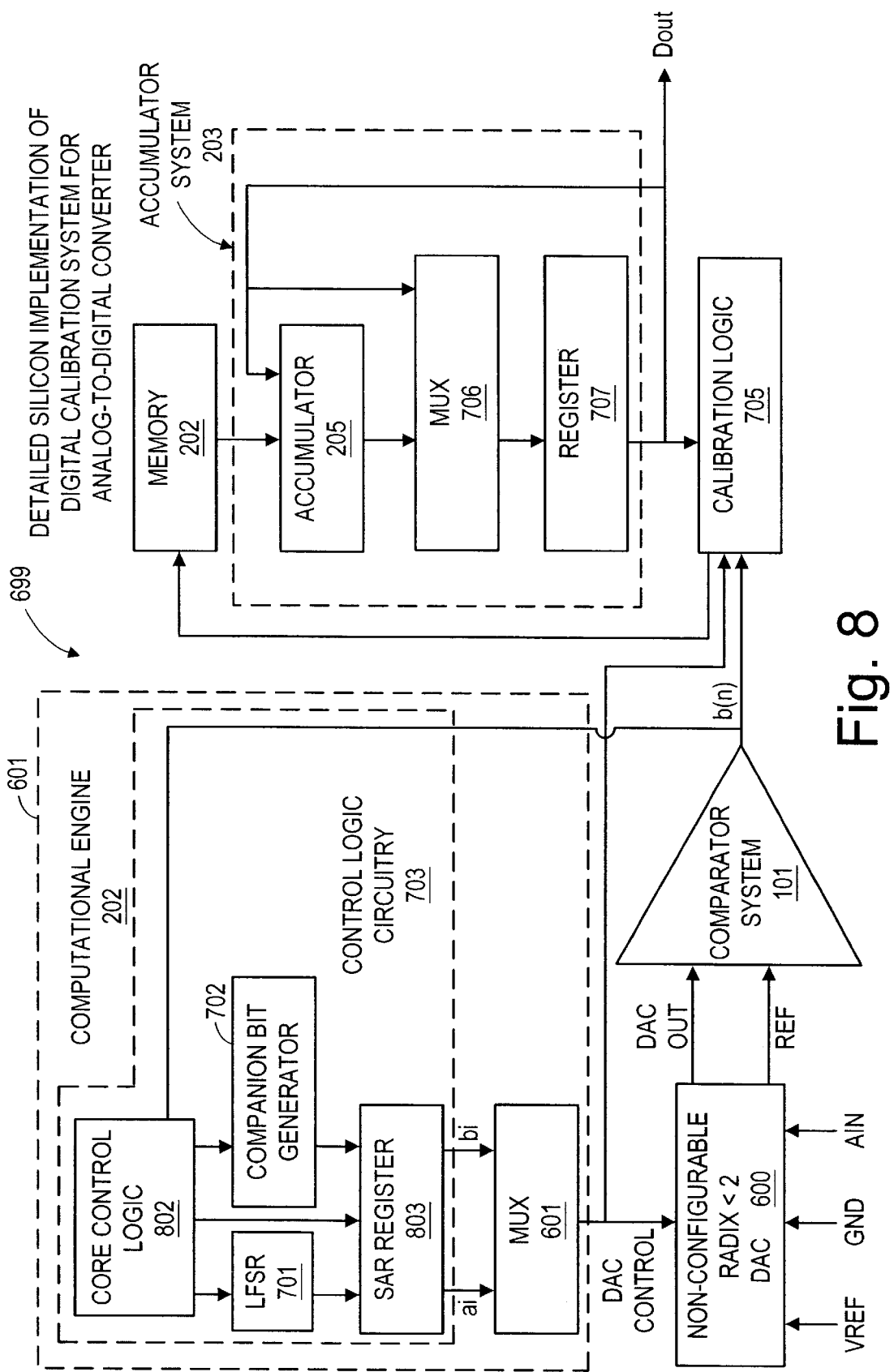
FIG. 8 is a block diagram of an successive approximation converter system according to the present invention.

Referring now to FIG. 8, there is shown a block diagram of the successive approximation converter system 699 according to the present invention which is designed for silicon implementation of a digital calibration system for an analog-to-digital converter. In particular, the converter system 699 includes a comparator system 101 having first and second inputs receiving respective reference (REF) and digital-to-analog converter (DAC) outputs signals. The converter system 699 further includes a radix-less-than-two non-configurable DAC 600 and a computational engine 601 according to one embodiment of the present invention. The radix-less-than-two non-configurable DAC 600 is configured to receive DAC control signals according to one embodiment of the present invention, and to produce output signals DAC OUT and REF in response to input signals VREF, GND, and AIN received by the radix-less-than-two non-configurable DAC 600. The computational engine 601 includes control logic system 700, memory system 202 connected to control logic circuitry 703, and accumulator system 203. One input of comparator system 101 is connected to radix-less-than-two non-configurable DAC 600, to enable receipt of an output signal. Another input of comparator 101 is connected to radix-less-than-two non-configurable DAC 600, to enable receipt of an input reference signal. The comparator system 101 produces an output binary signal set b(n). The control logic system 700 stores values in memory system 202 and produces DAC control signals for radix-less-than-two non-configurable DAC 600. The accumulator system 203 is connected to memory system 202 for receiving memory information for accumulation and to produce an output signal DOUT in response to input signals VREF, GND, and AIN. The converter system 699 further includes a comparator system 101 having first and second inputs, control logic system 700 connected to comparator system 101, and radix-less-than-two non-configurable digital-to-analog converter 600. One input of comparator system 101 is connected to radix-less-than-two non-configurable DAC 600 to receive a DAC output signal. Another input of comparator system 101 is connected to radix-less-than-two non-configurable DAC 600 to receive an input reference signal. Control logic system 700 produces a DAC control signal to be provided to radix-less-than-two non-configurable DAC 600. The converter system 699 further includes memory system 202 for receiving storage values from control logic system 700, and accumulator system 203 connected to memory system 202 for receiving memory information for accumulation, to enable production of output signal DOUT. Further, the control logic system 700 includes a multiplexer 704, calibration logic circuitry 705, and control logic circuitry 703. The multiplexer 704 receives first and second signal sets ai and bi from control logic circuitry 703, and selects one or the other of the signal sets ai and bi for transmission to radix-less-than-two non-configurable digital-to-analog converter 600. Calibration logic circuitry 705 is connected to memory system 202, accumulator system 203, comparator system 101, and multiplexer 704. Calibration logic circuitry 705 receives multiplexer signals from multiplexer 704 and comparator output signals b(n) from comparator system 101. Further, calibration logic circuitry 705 receives accumulator output signals DOUT from accumulator system 203. Memory system 202 receives control logic signals from control logic circuitry 703 and calibration logic signals from calibration logic circuitry 705. Memory system 202 provides output signals to accumulator system 203. The successive approximation converter system 699 according to the present invention particularly includes a comparator system 101 having first and second inputs, control logic circuitry 700 connected to comparator system 101, and nonconfigurable radix-less-than-two charge redistribution digital-to-analog converter 600. Further, the computational engine 202 includes control logic circuitry 703 for producing a DAC control signal to be provided to radix-less-than-two non-configurable DAC 600, a memory system 202 for receiving values from control logic circuitry 703, and an accumulator 205 connected to memory system 202 for receiving memory information for accumulation and to produce output signal DOUT. Further, the computational engine 601 includes control logic circuitry 703, multiplexer 601, and calibration logic circuitry 705. The multiplexer 601 receives first and second signal sets ai and bi from control logic circuitry 703. The control logic circuitry 703 includes a linear feedback shift register (LFSR) 701, a successive approximation register 803 connected to the LFSR 701, a companion bit generator 702, and a core control logic circuit 802. The multiplexer 601 selects one or the other of the signal sets ai and bi for transmission to radix-less-than-two non-configurable DAC 600. Accumulator system 203 includes an accumulator circuit 205, a multiplexer 706, and a register 707. Calibration logic circuitry 705 is connected to memory system 202, accumulator system 203, comparator system 101, and multiplexer 601. Calibration logic circuitry 705 receives multiplexer signals from multiplexer 601 and comparator output signals from comparator system 101. Further, calibration logic circuitry 705 receives accumulator output signals DOUT from accumulator system 203. Memory system 202 receives control logic signals from control logic circuitry 703 and calibration logic signals from calibration logic circuitry 703. Memory system 202 provides output signals to accumulator system 203. The memory system 202 is used for storing accumulated digital weights during SAR processing. The multiplexer 706 is connected to accumulator 205 for selecting between provided input digital values during SAR processing. The SAR register 703 is further connected to LFSR 701 for receiving random sampling bits, and to companion bit generator 702 for receiving companion bits. The radix-less-than-two non-configurable DAC 600 includes a radix less-than-two capacitor bank and is connected to comparator system 101. The LFSR 701 produces pseudo-random bit sequences to establish random sample bit sets for sampling operation incident to calibration. Comparator system 101 is connected to computational engine 601 which controls calibration and operation in accordance with the present invention. Memory 202 stores digital weights for modeling sampling and balancing capacitors, as well as representing offset voltages affecting SAR measurement as a digital weight. Core control logic circuitry 802 increments the LFSR 701 to determine pseudo-randomly the selection of sample bits used in SAR processing for auto- calibrating the radix-less-than-two non-configurable DAC 600. The computational engine 601 accordingly generates successive bit sequences including companion bits to connect progressively more comprehensive groups of balancing capacitors in the case of auto-calibration, or during conversion operation, the approximation of unknown input analog voltages. Successive approximation results in recursively increasing the precision and accuracy of the digital weights which are stored in memory system 202 as representations for sampling and balancing capacitors or voltage offsets. The accumulator system 203 produces a signed digital residue by comparing a sampling capacitor and balancing capacitor weights from memory system 202. The memory system 202 accumulates digital weights during SAR processing. The SAR register 803 is further connected to LFSR 701 for receiving random sampling bits, and to companion bit generator 702. The radix-less-than-two non-configurable DAC 600 includes a radix less-than-two capacitor bank and is connected to comparator system 101. The linear feedback shift register (LFSR) 701 produces pseudo-random bit sequences to establish random sample bit sets for sampling operation incident to calibration. Memory system 202 stores digital weights for modeling sampling and balancing capacitors, as well as representing offset voltages affecting SAR measurement as a digital weight. Core control logic circuitry 802 increments the LFSR 701 to determine pseudo-randomly the selection of sample bits used in SAR processing for auto-calibrating the radix-less-than-two non-configurable DAC 600. The computational engine 601 generates successive bit sequences including companion bits to connect progressively more comprehensive groups of balancing capacitors for in one case auto-calibration, or another case, approximation of unknown input analog voltages. Successive approximation results in recursively increasing the precision and accuracy of the digital weights which are stored in memory system 202 as representations for sampling and balancing capacitors or voltage offsets. Accumulator system 203 produces a signed digital residue by comparing a sampling capacitor and balancing capacitor weights from memory system 202.

Figure 9:
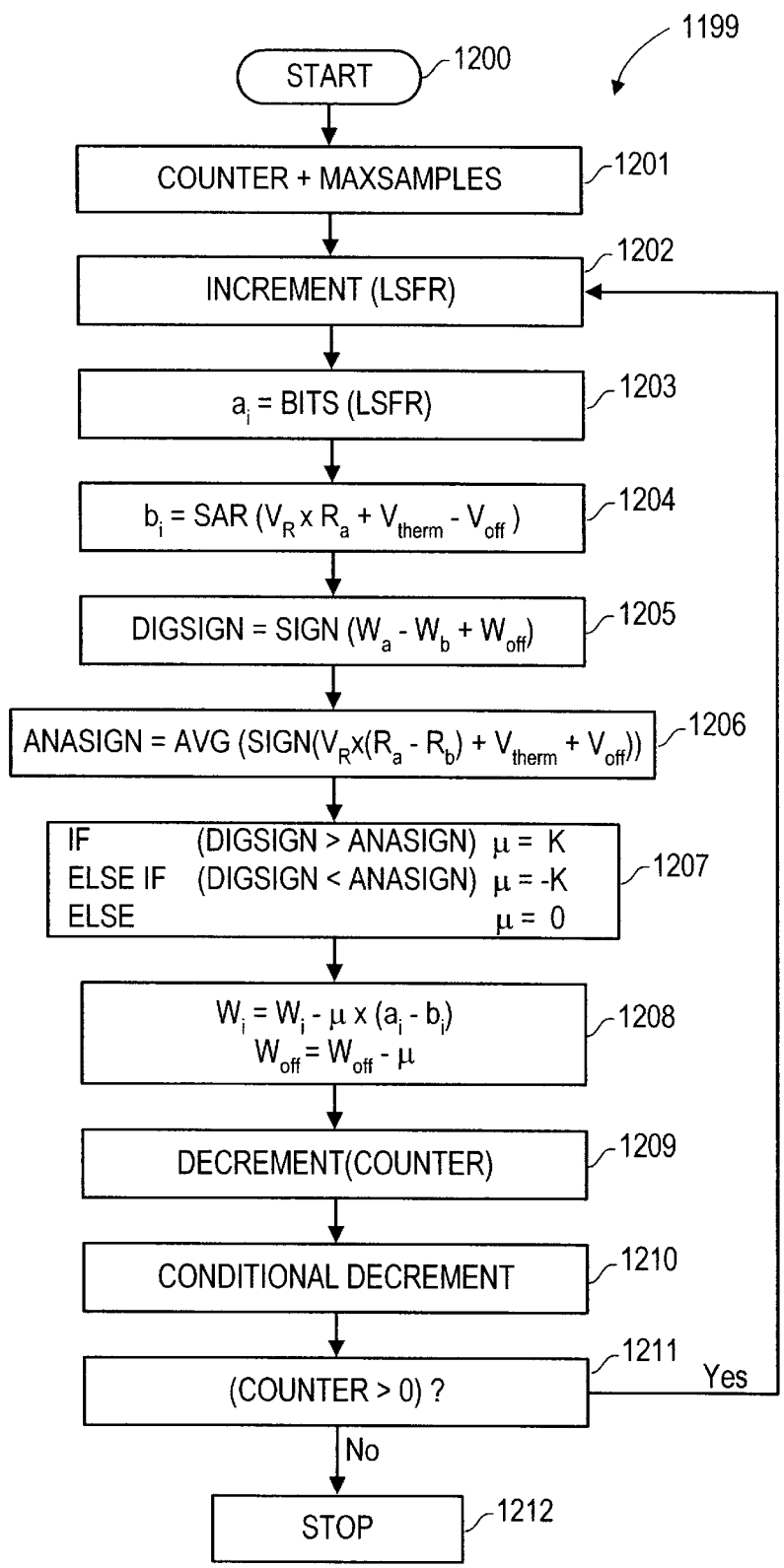
FIG. 9 is a flow chart of an adaptive capacitor digital weight calibration method according to the present invention.

Referring now to FIG. 9, there is shown a flow chart of an adaptive capacitor digital weight calibration method 1 199 according to the present invention. In particular, the Figure shows the calibration method 1199 including starting calibration in process 1200, and setting or resetting a counter to a selected maximum sample number in process 1201. Further, the calibration method 1 199 includes providing a pseudorandom (referred to as "random" herein) input by incrementing the linear feedback shift register in process 1202, selecting sampling capacitors from the random bits determined by the LFSR in process 1203, as well as sampling and converting to approximate the sampling bit set $a_i$ with a balancing bit set $b_i$ which includes predetermined companion bits in process 1204. Further, the calibration method 1199 determines the sign of the digital residue by taking the difference between sample bitweights ($W_a$) and balancing bit weights $W_b$ plus the offset weight $W_{off}$ in process 1205, and determining the residue in process 1206. The signed digital residue is determined by adding the offset voltage weight to the balancing bit weight and subtracting therefrom the sample bit weight. The signal analog residue is obtained by determining the average sign of the sum of the thermal and offset voltages and adding thereto the reference voltage times the difference of the balancing capacitor ratio $R_b$ and sample capacitor ratio $R_a$. According to the present invention, the difference between the signed analog and digital residues is a signed error feedback value which modifies particular digital weights in memory by determining an average of the sum of offset and thermal voltages plus the product of the reference voltage times the difference between sample and balancing voltage ratios. The calibration method 1199 further includes deciding the direction of the error based upon sign information in process 1207, causing the feedback constant $\mu$ to be set to a particular constant level depending upon the number of samples (see FIG. 10). In case the digital sign is greater than the analog sign, $\mu$ is set to the positive of the particular selected constant level. A negative $\mu$ is used if the digital sign is less than the analog sign. Finally, $\mu$ is set to zero if the digital and analog residue signs are the same. The calibration method 1199 further includes adjusting particular digital weights including the offset weight respectively by an amount equal to the feedback constant $\mu$ times the difference between a particular sampling ai and balancing bit bi, and by the feedback constant itself in the case of the offset weight in process 1208, and decrementing a counter to complete an iteration of the number of samples in processes 1209, 1210. The calibration method 1 199 further includes determining whether the value of the sample counter is greater than zero in process 1211, and if so then repeating linear feedback shift register incrementation step in processes 1202 through 1210. If the value of the sample counter is not greater than zero, then process 1211 determines whether to decrement $\mu$ and if so then resetting the sample counter and repeating the calibration method from process 1201, and then finally halting calibration operation at completion in process 1212. Determining the sign of the analog residue is accomplished in process 1206 by subtracting the balancing capacitor ratio $R_b$ from the sampling capacitor ratio $R_a$. Determining the sign of the digital residue is accomplished in process 1205 by subtracting $W_b$ from $W_a$ and adding $W_{off}$. Since the first SAR approximation relates to the most significant bit, the magnitude of $\mu$ according to the present invention is smallest when the number of samples to be taken is large. The calibration method 1199 according to the present invention further depends upon the following relationships:

$$Q_{samp}=Q_{conv};$$

where $Q_{samp}$ is the charge sampled and $Q_{conv}$ is the charge converted; and $$V_R \times C_a + Q_{therm} + Q_{inject} = V_R \times C_b - (V_{os}-V_x) \times C_{tot}$$

where $V_R$ is a selected reference voltage, $C_a$ is the capacitance of a first capacitor group, $Q_{therm}$ is the thermal charge, $Q_{inject}$ is the injected charge, $C_b$ is the capacitance of a second capacitor group, $V_{os}$ is an offset voltage value, $C_{tot}$ is the total capacitance, and $V_x$ is the analog residue voltage. Further, $$C_a = \Sigma_i(a_i \times C_i); \text{ and } C_b = \Sigma_i(b_i \times C_i); \text{ for } a_i, b_i \in \{0,1\} \text{ for } a_i \neq b_i.$$

The capacitance values $C_a$ and $C_b$ represent first and second groups of capacitors respectively the groups of sampling and balancing capacitors, with $a_i$ and $b_i$ being the sets of binary coefficients that determine whether the ith capacitor is part of a particular capacitor group or not. The sampling bits $a_i$ are not equal to the successive approximation register result bits $b_i$ because the successive-approximation testing method according to the present invention adds extra weight by use of companion bits to each test, skewing the results in the direction of the overlap of the system. If only the most significant bit in the sampling bits $a_i$ were to be used, the extra weight added to the first test by the companion bits would cause the MSB not to be selected for inclusion in the group of $b_i$ bits determined for balancing the charge produced by the sampling bits, according to the present invention. Some other combination of capacitors whose collective weight is substantially equal to the MSB would instead be selected according to the present invention. Further, $$V_R \times C_a + Q_{therm} + Q_{inject} = V_R \times C_b - (V_{os}-V_x) \times C_{tot};$$

$$V_x \times C_{tot} = V_R \times (C_a - C_b) + Q_{therm} + Q_{inject} + V_{os} \times C_{tot};$$

$$V_x = V_R \times \frac{(C_a - C_b)}{C_{tot}} + V_{therm} + (V_{inject} + V_{os});$$

$$R_a = \frac{C_a}{C_{tot}} = \frac{\sum_i (a_i \times C_i)}{C_{tot}};$$

$$R_b = \frac{C_b}{C_{tot}} = \frac{\sum_i (b_i \times C_i)}{C_{tot}}; \text{ and}$$

$$V_{off} V_{inject} + V_{os}.$$

Accordingly, the signed analog residue is a function of the difference of sampling and balancing capacitor rates:

$$V_x = V_R \times (R_a - R_b) + V_{therm} + V_{off}.$$

The sampling capacitors $a_i$ and the conversion result capacitors $b_i$ are both known. The sign of the residue voltage $V_x$ is known. Thus, the signed analog residue, $V_x = V_R \times (R_a - R_b) + (V_{therm} + V_{off})$; and the digital residue, $W_x = (W_a - W_b) + (W_{off})$. The weights $W_a$, $W_b$, and $W_{off}$ are adapted so that the sign of the digital residue $W_x$ matches the average analog residue sign. Thus, Sign $(W_x)$=Avg(Sign($V_x$)) when $\{R_a, R_b, V_{off}/V_R\} = \{W_a, W_b, W_{off}\}$; and $$V_x = V_R \times (R_a - R_b) + V_{therm} + V_{off};$$

$$W_x = (W_a - W_b) + W_{off};$$

$$W_a = \Sigma_i(a_i \times W_i);$$

and $$W_b \Sigma_i(b_i \times W_i).$$

Further:

$$V_x = V_R \times (R_a - R_b) + V_{therm} + V_{off};$$

$$W_x = (W_a - W_b) + W_{off};$$

$$W_i[k+1] = W_i[k] - \mu \times (a_i - b_i);$$

and $$W_{off}[k+1] = W_{off}[k] - \mu.$$

The comparator noise at the time of the analog residue sign-check helps dithering and improves convergence speed and final resolution according to the present invention. Averaging the thermal noise according to the present invention improves the final achievement of convergence. Thermal noise is averaged according to the present invention by re-sampling the input capacitors and "plugging-in" the same output capacitors as used in the prior conversion, then checking the sign of each new residue. According to the present invention, the same $a_i$'s as the previous sampling cycle are resampled and re-balanced with the same $b_i$'s as in the result of the previous conversion cycle. Then, the sign of the analog residue is checked with other sign results associated with those sets of $a_i$'s and $b_i$'s. Resampling according to the present invention is performed with the $a_i$'s, and balancing the charge is performed with the $b_i$'s for the sign-checks. Thermal noise is bound up in the $b_i$'s from the conversion process. The two sets of weights are not equal, but they are close enough to each other to provide useful information about the relationships of the capacitor combinations. Comparator noise is accordingly averaged every time the sign is rechecked.

Figure 10:
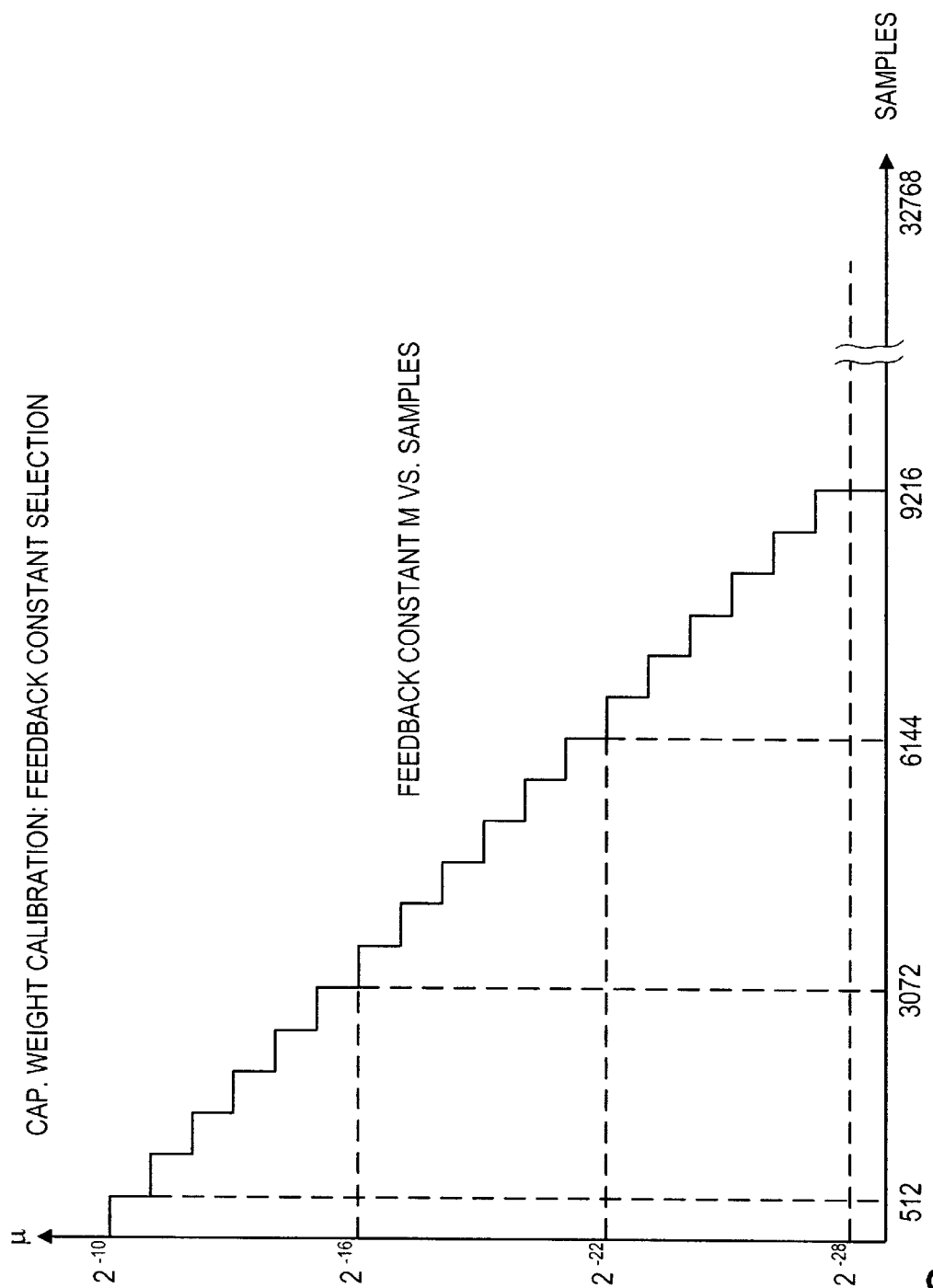
FIG. 10 is a diagram of a feedback constant used to determine the amount of according to the present invention correction to be applied to digital weights as a function of sample number, according to the present invention.

Referring now to FIG. 10, there is shown a diagram of a feedback constant $\mu$ used to determine the amount of correction to be applied to digital weights as a function of sample number, according to the present invention. In particular, the Figure shows a diagram of the feedback constant $\mu$ as an inverse function of the number of samples to be taken. According to the present invention, the magnitude of the feedback constant $\mu$ increases as the number of samples left to be taken during calibration decreases. The larger $\mu$ which thus exists at the end of calibration speeds convergence to final approximation of samples taken, and this counters a diminishing correction magnitude based upon convergence of the difference between sampling and balancing capacitances near the end of each round of calibration.

According to the present invention, a radix less-than-two capacitor array 105 used as a companion bit charge redistribution DAC, according to one embodiment of the present invention. Such a capacitor array includes first, second, and third sets of parallel connected capacitors; a dummy capacitor; and first and second connection capacitors. A second connection capacitor is connected to the comparator. A first set of parallel connected capacitors includes seven (7) capacitors $C_0$–$C_6$ with one embodiment of the present invention in parallel with dummy capacitor, and each of the capacitors in the first capacitor set is connected to first connection capacitor. With such an embodiment of the present invention, the second set of, parallel connected capacitors includes six (6) capacitors $C_7$–$C_{12}$, and each of the capacitors in the second set is connected to first connection capacitor and to the second connection capacitor. The third set of seven (7) capacitors $C_{13}$–$C_{19}$, according to one embodiment of the present invention and each of them is connected to the second connection capacitor 1506 and to the comparator. According to one embodiment of the present invention, capacitors $C_1$–$6_{19}$ are scaled as radix less-than-two capacitors, with the capacitance $C_1 = r^*C_0$, where r is a selected positive real number less than two. Further according to one embodiment of the present invention, $C_n = r^n \times C_0$, where r is a number between zero and two; n is a selected positive integer; and $C_{19}$ is the most significant capacitor in the capacitor array. Each of the capacitors is connected to a switch to VIN, VREF, and GND.

According to the present invention, the relative weights of the elements of each radix less than two series are determined by successive digital and analog processing. In particular, the successive approximation analog-to-digital converter (ADC) according to the present invention measures the relative non-binary values associated with sampling and balancing capacitors for storage as digital weights in a memory for the ADC. At each conversion step during DAC calibration, an analog signal corresponding to the sum of SAR determined radix less than two series values is compared with an analog reference input using randomly selected sampling capacitors. For successive approximation of unknown values, and analog signal corresponding to the sum of at least one of the series values plus a combination of predetermined companion bit values according to the present invention is compared with an analog input using randomly selected sampling capacitors. If the unknown charge or voltage value is greater than the sum of selected balancing capacitor values plus predetermined companion bit values having a gross value of on the order of 50% of the specific redundance corresponding to the particular significant bit value, the most significant capacitor of the balancing capacitor set is kept as part of the final successive approximation group to represent the sampled input voltage. If the selected balancing and companion bit set produces an approximation value in excess of the tested or sampled voltage value, the most significant capacitor of the attempted balancing set is not kept for further successive approximation relating to the particular sampled voltage value. The companion bits thus provide a bias against keep decisions. The companion bits thus provide an envelope or margin which prevents noise-induced over approximation of sampled values. The use of the companion bits accordingly promotes monotonicity and convergence to the approximated value without discontinuance or gaps in resolution. In particular, an n-shift invariant capacitor testing sequence according to one embodiment of the present invention divides a search space into first and second regions, enabling redundancy of radix-less-than-two capacitor scaling and permitting recovery across search-space boundaries in case of noise-induced incorrect successive approximation search decisions. Further according to one embodiment of the present invention, a companion bit group (CBG) includes a predetermined set of bits, each bit being separated from the next most significant bit in the companion bit group by at least two orders of magnitude, e.g., an n-shift invariant amount. Further according to one embodiment of the present invention, the number of companion bits is three, four, or five bits, for example without limitation. According to another embodiment of the present invention, the most significant of the companion bits is separated from the reference bit to which it is a companion by a separation space of at least two orders of magnitude. One bit sequence according to the present invention can be represented as XXX1001001, with the first "1" being a reference bit which is separated from the first companion bit by two "zero" bits which represent a separation of two orders of magnitude. Similarly, the separation between the second and third "1" bits is again two orders of magnitude, according to the indicated example. In a radix 1.8 system, the sum of the weights of the bits below a given bit can be as much as 1.25 times the weight of the bit itself. Further according to one embodiment of the present invention, the companion bit sequence adds up to 0.125, which is one half of the envelope amount between the normalized value of the given bit (i.e., "1") and the sum of the lesser bits (1.25). When added to the value of the given bit, i.e., 1.0, the test bit accordingly falls approximately half-way within the envelope between the value of the given bit and the sum of the weights of the bits below the given bit. The indicated system overlap or envelope according to the present invention diminishes as fewer and fewer bits remain below the selected test bit. The overlap is moreover lost when there are less than 3 bits below the test bit in a radix 1.8 system. According to the present invention, the overlap is in general approximately $1(r-1)$, for a sufficient number of capacitors, e.g., more than eight capacitors. The overlap for a given bit is more comprehensively $C_x(1/r^a)/(r-1)$, where a is the number of bits below the bit concerned. Normalizing for $C_x$, the cumulative companion bit weight equals $1/r^n+1/r^{2n}+1/r^{3n}+\ldots+1/r^{mn}$, where n is a selected shift value and m is a predetermined number of companion bits. To reach ½ of the overlap, the above cumulative companion bit weight according to one embodiment of the present invention, is set equal to $(1/(r-1)-1)/2$, resulting in $(1-1/r^{mn})/(r^n-1)=(2-n)/2(r-1)$. Then, neglecting $1/r^{mn}$ as too small, for sufficient m and n, $n=(1-(\log(2-r))/\log r)$. For $r=1.8$, $n=$approximately 4 according to the present invention. The value of n changes with r according to the present invention, so that another integer value n is applicable for radix 1.7 and 1.9. Such a system according to the present invention remains monotonic and symmetrically noise tolerant during decision making incident to successive approximation.

What is claimed is:

1. A method of digitally calibrating a set of radix-less-than-two (RLTT) capacitors selectively connectable to an input voltage, a reference voltage, and a ground voltage, in an analog-to-digital converter (ADC) including a charge redistribution digital-to-analog converter (CRDAC); comprising:
generating a set of binary values (SBV) for selecting certain ones of said RLTT capacitors in said CRDAC for sampling;
sampling charge from a reference voltage using selected ones of said RLTT capacitors according to said SBV;
generating another set of binary values (ASBV) in successive approximation of said SBV; and
determining digital weight values corresponding to said SBV and said ASBV.

2. The method according to claim 1 including generating said SBV by random selection.

3. The method according to claim 1 including selecting said SBV with a linear feedback shift register.

4. The method according to claim 1 including determining a digital sign from the difference between the sum of the digital weight values of said SBV and the sum of the digital weight values of said ASBV.

5. The method according to claim 1 including calibrating said RLTT for a selected range of input voltages by generating a plurality of SBVs, and for each selected SBV,
sampling charge from a reference voltage using particular selected ones of said RLTT capacitors according to the particular SBV generated;
generating a corresponding ASBVs in successive approximation of each said particular SBV; and
determining digital weight values corresponding to each particular SBV and corresponding ASBV.

6. The method according to claim 1 including determining said digital weight values as a function of a diminishing variable $\mu$.

7. A method for calibrating a digital memory with capacitor weights to be used in subsequent approximation of unknown voltages, comprising:
generating a first bit sequence (FBS) representing the switched on states of each of a plurality of capacitors (PCS) in a predetermined capacitor array (CA) of a charge redistribution digital-to-analog converter (CRDAC);
increasing the numerical value (NV) of said FBS;
sampling a voltage to said CA by applying a reference voltage to those of said PCSs which are switched on consistently with said FBS;
successively generating the result bits of a second bit sequence (SBS) during successive approximation, by identifying the switched-on states of particular capacitors in said CRDAC which are able substantially to nullify the charge on the CRDAC including the increased charge due to the increase made in the NV of said FBS;
determining the digital weights corresponding to said identified capacitors able to cancel the applied charge; and
storing said determined digital weights in a digital memory for subsequent retrieval to effect successive approximation operation to determine the value of an input unknown voltage level.

8. The method according to claim 7 including successively approximating with a selected added weight amount (SAWA).

9. The method according to claim 8 wherein said SAWA skews the result of conversion into an overlapping region.

10. The method according to claim 7 wherein sampling is accomplished with a group of capacitors $Ca=\Sigma_i(a_i\times C_i)$, where Ca is a pseudo randomly selected group of sampling capacitors defined by a set of binary coefficients $a_i$ which determines whether the ith capacitor of the CA is part of the sampling group, where $C_i$ is the ith capacitor of the CA.

11. The method according to claim 7 wherein the sampled charge is converted to a conversion group of capacitors $C_b=\Sigma_i(b_i\times C_i)$, where $C_b$ is a group of capacitors defined by a set of binary coefficients $b_i$ which establish inclusion in the conversion group, where $C_i$ is the ith capacitor of the CA.

12. The method according to claim 7 wherein a first group of capacitors $Ca=\Sigma_i(a_iC_i)$ is sampled and the sampled charge is converted to a second group of capacitors $C_b=\Sigma_i(b_iC_i)$, where $a_i$ is a first set of binary coefficients used to select particular capacitors $C_i$ used for sampling, $b_i$ is a second set of binary coefficients used to select particular capacitors $C_i$, such that the analog residue $V_x$ is a function of the offset voltage $V_{off}=\Sigma_i a_i C_i - \Sigma_i b_i C_i$, where $C^i$ is the ith capacitor of the CA, and the digital residue $W_x$ is a function of the offset weight $W_{off}$ and $W_a-W_b$ where $W_a$ represents the digital weights associated with $a_i$ and $W_b$ represents the digital weights associated with $b_i$.

13. The method according to claim 12 including determining the signs of the analog and the digital residues.

14. The method according to claim 13 including increasing digital weights associated with a first set of capacitors and decreasing the digital weights associated with a second set of capacitors, when the sign of the digital residue is less than the sign of the analog residue.

15. The method according to claim 13 including decreasing the digital weights associated with the first set of capacitors and increasing the digital weights associated with the second set of capacitors, when the sign of the digital residue is greater than the sign of the analog residue.

16. The method according to claim 13 including adapting the digital weights as a function of a feedback constant which inversely proportional to the number of samples taken of said first selected set of capacitors.

17. The method of claim 7 wherein said sampling of said voltage is accomplished by:

providing a selected group of capacitors, numbered i=1, . . . , N, with capacitor number i having a known capacitance value, where N is a selected positive integer that is at least 2; and computing at least one numerical capacitance value C for the selected group as a sum $\Sigma a_i C_i$, where each coefficient $a_i$ is chosen to be equal to 0 if the capacitor number i is not included in the sampling group and is chosen to be equal to a selected non-zero value if the capacitor number i is included in the sampling group.

18. A method for calibrating a digital memory having capacitor weights to be used in approximating an unknown voltage signal, the method comprising:

generating a first bit sequence, having a first numerical value and representing switched-on capacitor states for a selected first sub-array of capacitors, drawn from an array of capacitors that are part of a charge redistribution digital-to-analog converter (CRDAC), where the CRDAC has an accumulated charge corresponding to the first numerical value;

increasing the numerical value of the first bit sequence by a selected increment to obtain a second numerical value;

sampling a voltage signal provided for the capacitors in the first sub-array by applying a reference voltage to each switched-on capacitor in the first sub-array;

successively generating digital bits of a second bit sequence by identifying a second sub-array of capacitors, drawn from the array of capacitors, that substantially nullify an accumulated charge on the CRDAC corresponding to the second numerical value, when each capacitor in the second sub-array is switched on; and determining and storing a digital weight associated with each capacitor in the second sub-array.

19. The method of claim 18, wherein said sampling of said voltage is accomplished by:

providing a selected group of capacitors, numbered i=1, . . . , N, with capacitor number i having a known capacitance value, where N is a selected positive integer that is at least 2; and computing at least one numerical capacitance value C for the selected group as a sum $\Sigma a_i C_i$, where each coefficient $a_i$ is chosen to be equal to 0 if the capacitor number i is not included in the sampling group and is chosen to be equal to a selected non-zero value if the capacitor number i is included in the sampling group.

* * * * *